US009002312B1

(12) United States Patent
Wyse (10) Patent No.: US 9,002,312 B1
(45) Date of Patent: Apr. 7, 2015

(54) DYNAMIC BIASING FOR AN ACTIVE CIRCUIT

(75) Inventor: Russell D. Wyse, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 13/529,335

(22) Filed: Jun. 21, 2012

(51) Int. Cl.
H04B 1/16 (2006.01)
H04B 1/58 (2006.01)

(52) U.S. Cl.
CPC ........................... *H04B 1/58* (2013.01)

(58) Field of Classification Search
USPC ........... 455/126, 130, 234.1, 298, 343, 343.1; 330/296, 298; 375/346
See application file for complete search history.

(56) References Cited

U.S. PATENT DOCUMENTS

| | | | | |
|---|---|---|---|---|
| 4,547,746 A | * | 10/1985 | Erickson et al. | 330/298 |
| 5,451,907 A | * | 9/1995 | Keane et al. | 330/296 |
| 7,831,210 B1 | * | 11/2010 | Freeman et al. | 455/73 |
| 2002/0146993 A1 | * | 10/2002 | Persico et al. | 455/126 |
| 2004/0077324 A1 | * | 4/2004 | Wieck | 455/234.1 |
| 2004/0229580 A1 | * | 11/2004 | Chen | 455/130 |
| 2006/0227910 A1 | * | 10/2006 | Ramasubramanian et al. | 375/346 |
| 2007/0021087 A1 | * | 1/2007 | Turner | 455/298 |
| 2009/0195310 A1 | * | 8/2009 | Holenstein et al. | 330/254 |

OTHER PUBLICATIONS

Microwave Journal, New Products, Low Noise Amplifiers, Jan. 2012, p. 156.

\* cited by examiner

*Primary Examiner* — Wesley Kim
*Assistant Examiner* — Raj Chakraborty
(74) *Attorney, Agent, or Firm* — Angel N. Gerdzhikov; Donna P. Suchy; Daniel M. Barbieri (57) ABSTRACT

A dynamic bias circuit for an active RF circuit includes an RF sensor coupled to the input port of the active RF circuit to sense the amplitude of the incoming RF signal. A control circuit is coupled to the RF sensor and a bias source. The bias signal to the active circuit is dynamically adjusted by summing the amplitude of the incoming RF signal with the nominal DC signal from the bias source. As the power in the incoming RF signal increase, so to does the bias signal to the active circuit, which allows the active RF circuit to increase its linear range of operation in the presence of stronger signals. The active circuit is designed such that its gain and phase behavior is nearly constant over large bias adaptation ranges without distortion when bias adjustments are dynamically made to the active circuit.

13 Claims, 8 Drawing Sheets

DYNAMIC BIASING FOR AN ACTIVE CIRCUIT

BACKGROUND

The present invention generally relates to a bias circuit for an active circuit. More particularly, the present invention is directed to a dynamically adjusting bias circuit for an active circuit and multiple cascaded active circuits, which can each dynamically adapt bias. Active circuits that control RF signals, such as low-noise amplifiers (LNAs) and mixers, are crucial components in a wireless communication system. In a receiver, an RF signal is typically received from an antenna, passes to a filter, and then immediately encounters an LNA. The linearity of the LNA, therefore, significantly affects the dynamic range of the receiver. Mixers down-convert a signal from a high frequency to a low frequency by mixing the signal with a local oscillator (LO) signal. The mixer is typically positioned after the LNA and can also limit the dynamic range of the receiver. A high linearity receiver has improved immunity against strong signals and against strong interferences (i.e., jammers). That is, a high linearity receiver has less distortion (e.g., intermodulation product levels, gain compression, phase non-linearity, etc.) in the presence of strong signals or strong interferences than a low linearity receiver. Unfortunately, more DC power is required for more linearity.

High linearity, however, is not always required. In the presence of signals with normal or below signal power, active circuits can process the desired signals without distortion while operating at low bias conditions. However, to meet the linearity specification in the presence of a jamming signal, the active circuits must be properly biased to maintain linearity so as not to distort the desired signals. Such bias conditions require significantly more power than required in most situations; however, in high-risk environments, the active circuit must be able operate in the presence of jamming signals, so an unnecessarily large biasing current must be maintained. This reduces battery life, increases the heat load of the system, and reduces the lifetime of the electronic devices in the system.

Accordingly, there is a need in the art for an active circuit that can dynamically raise its bias in the presence of strong signals with minimal signal distortion and minimize power consumption by reducing the bias to the active circuit in the absence of strong signals.

SUMMARY

The present invention provides a dynamic bias circuit for an active RF circuit. The dynamic bias circuit includes a broadband RF sensor coupled to the input port of an active RF circuit, with broad bias range characteristics, to sense the amplitude of the incoming RF signal. The active circuit preferably has generally constant gain and phase behavior across the bias adjustment ranges to avoid distortion of the signal. A control circuit is coupled to the RF sensor and a bias source. The bias signal to the active circuit is dynamically adjusted by summing the sensed amplitude of the incoming RF signal with the nominal DC signal from the bias source. As the power in the incoming RF signal increases, so to does the bias signal to the active circuit, which allows the active RF circuit to increase its linear range of operation in the presence of stronger signals with minimal gain/phase distortion.

There is also provided a method for dynamically adjusting a bias signal for an active RF circuit. The method includes sensing the RF signal at the input port of the active RF circuit and summing with the nominal DC signal to produce a bias signal that dynamically changes with RF power level. The dynamically adjusted bias signal is provided to the active RF circuit, which allows the active RF circuit to increase its linear range of operation in the presence of stronger signals with minimal distortion to its gain and phase characteristics.

These and other aspects, features, and advantages of the invention will become apparent upon review of the following description taken in connection with the accompanying drawings. The invention, though, is pointed out with particularity by the appended claims.

DESCRIPTION OF THE ILLUSTRATIVE EMBODIMENTS

Figure 1:
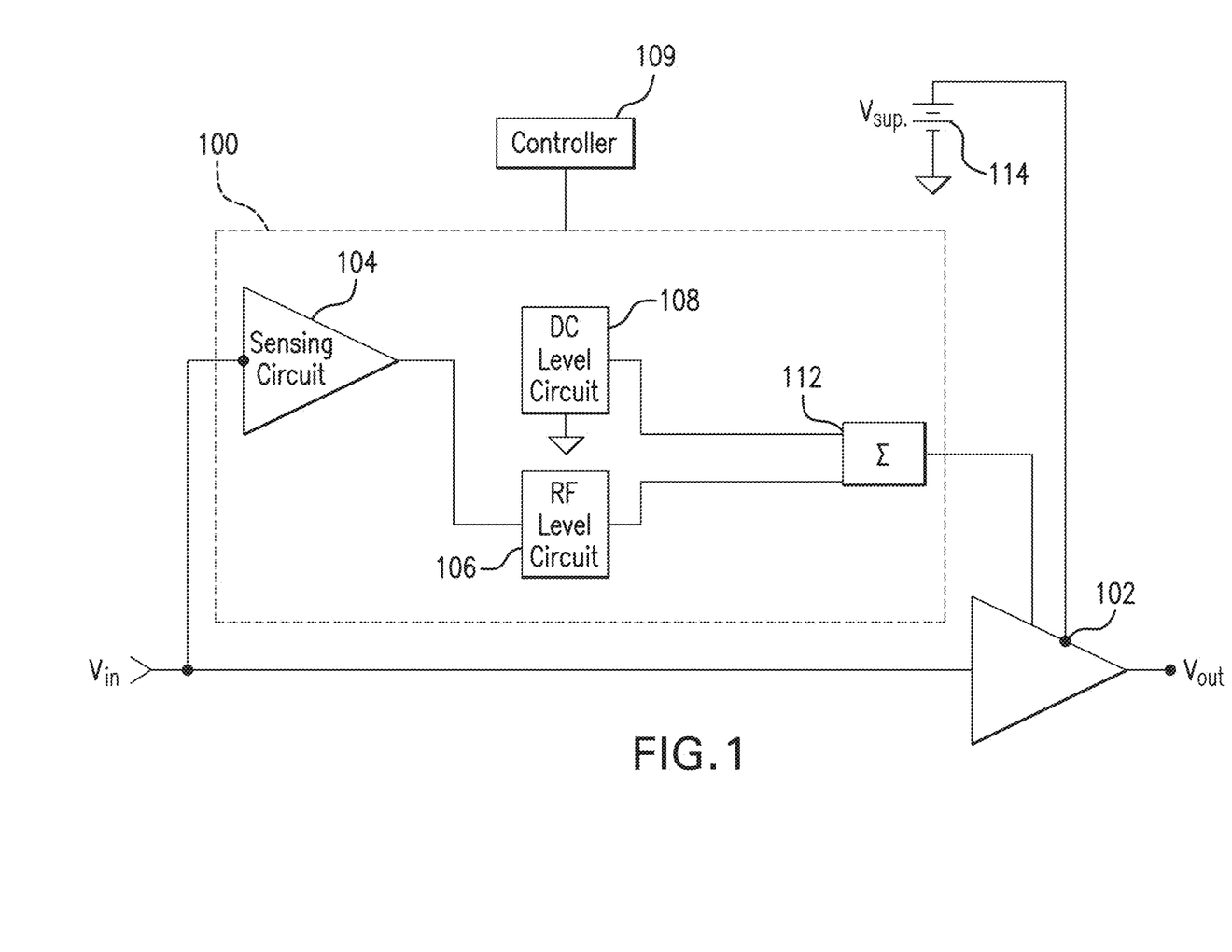
FIG. 1 is a schematic diagram of a dynamically adjusting bias circuit coupled to an active RF circuit that maintains key operating characteristics over broad bias ranges, in accordance with the present invention.

FIG. 1 shows a schematic diagram of a dynamically adjusting bias circuit 100 coupled to an active circuit 102. Active circuit 102 can be any circuit that controls a signal and has generally constant gain and phase behavior across bias adjustment ranges to avoid signal distortion, including an amplifier or attenuator, a power amplifier, a low-noise amplifier, variable gain amplifier (VGA), mixer or a variable gain mixer (VGM). For dynamic bias adjustment to be most capable, active circuit 102 should have generally constant gain and phase behavior across the bias adjustment ranges to prevent signal distortion. Bias circuit 100 senses the power level of an incoming RF signal to active circuit 102, and dynamically adjusts the bias to active circuit 102 in response to an increasing power level of the RF signal. The bias signal for active circuit 102 remains at a low level in the presence of low-power RF signals to conserve energy, but can increase quickly and dynamically when the power level increases to maintain the linearity of the active circuit 102.

Bias circuit 100 has a sensing circuit 104 coupled to an RF input port of active circuit 102. A high impedance input port on sensing circuit 104 substantially blocks RF energy in the incoming RF signal from leaking into the dynamic bias circuit 100 path, so the RF signal remains substantially undisturbed by the presence of bias circuit 100. Sensing circuit 104 senses and amplifies the RF signal for an RF power-level circuit 106.

RF power-level circuit 106 receives the amplified RF signal from sensing circuit 104 and determines its amplitude. The amplitude of an RF signal is the difference between its maximum and its minimum value during one cycle, and is measured in volts and amps. The amplitude is directly related to the strength, or power, of the RF signal. In that regard, by determining the amplitude of the RF signal, RF power-level circuit 106 quantifies its strength.

A controller 109 can be used to turn on or off the dynamic RF power adaptation, as well as control the slope of bias adjustment compared to the RF power. The nominal DC level from a DC level circuit 108 can also be setup over a wide range of bias. The present invention uses a digital serial peripheral interface (SPI) to setup the operating characteristics of bias control circuit 100, although any type of controller can be used.

A summing circuit 112 combines the nominal DC level from DC level circuit 108 and sums it with a dynamically sensed RF amplitude bias adjusted signal from an RF level circuit 106. The output of summing circuit 112 supplies a bias to active circuit 102. As the power level of the RF signal increases, summing circuit 112 raises the bias for active circuit 102 in an amount above the nominal bias signal. As the power level of the RF signal decreases, summing circuit 112 lowers the bias for active circuit 102 down toward the level of the nominal bias signal. In the illustrated embodiment, although the bias for active circuit 102 is controlled by summing circuit 112, one skilled in the art would recognize, however, that any type of control circuit that responds to changes in the incoming RF signal by increasing or decreasing the bias signal in response thereto is contemplated within this disclosure.

A voltage supply 114 is coupled to active circuit 102 to supply active circuit 102 with enough voltage to enable full dynamic range over the desired bias adjustment and RF input signal range.

Figure 2:
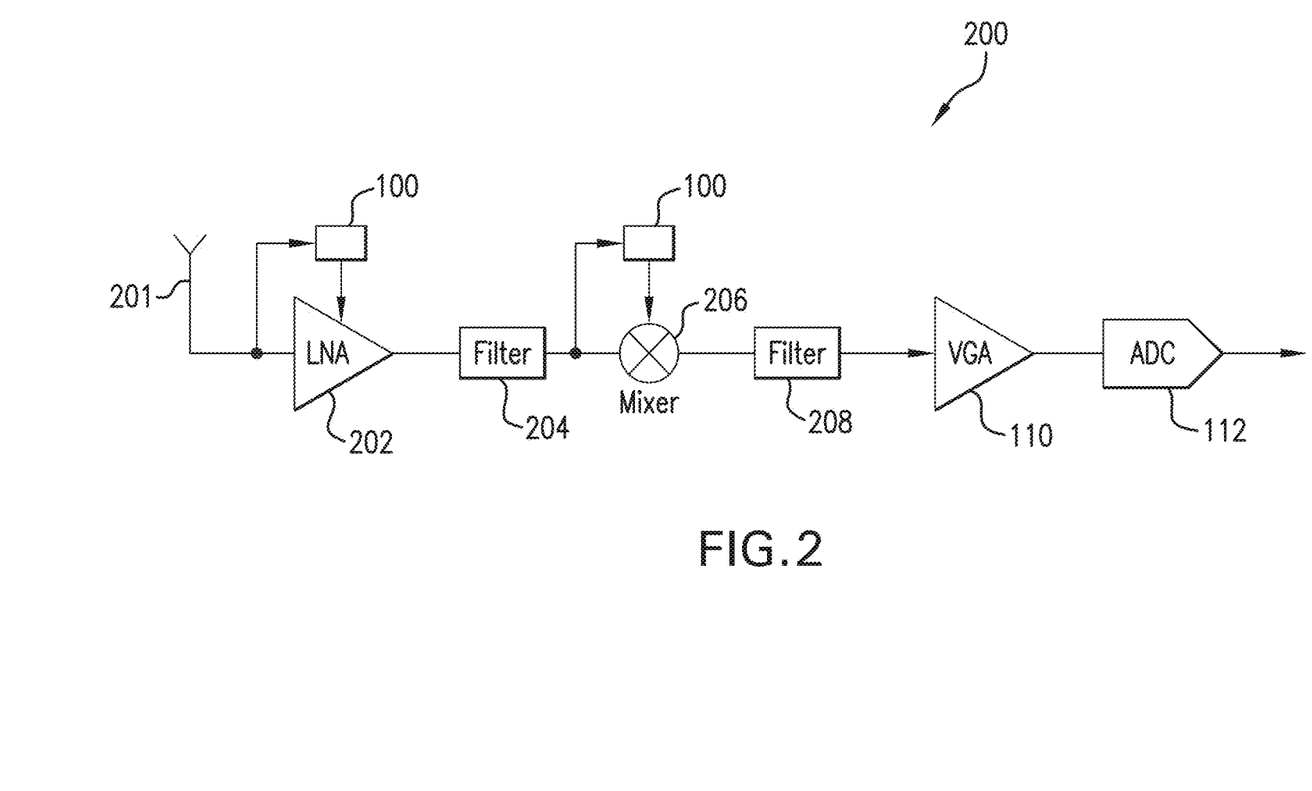
FIG. 2 is a system block diagram of a portion of a signal processing system in accordance with the present invention.

FIG. 2 shows an exemplary signal processing system 200 incorporating bias circuit 100. Signal processing system 200 is configured to receive an incoming RF signal from an antenna 201. A low-noise amplifier 202 coupled with bias circuit 100 amplifies the incoming RF signal, then provides the amplified RF signal to a filter 204 to remove the unwanted components of the amplified RF signal. A mixer 206 coupled with a bias circuit 100 converts the amplified RF signal to an intermediate frequency (IF) signal before a filter 208 removes unwanted components of the IF signal. A variable gain amplifier 110 amplifies the IF signal to an optimum level for signal processing by an analog-to-digital converter 112. One skilled in the art will recognize that the above is only a small part of a device and that there are a multitude of signal processing functions possible depending upon the specific use of signal processing system 200.

Figure 3:
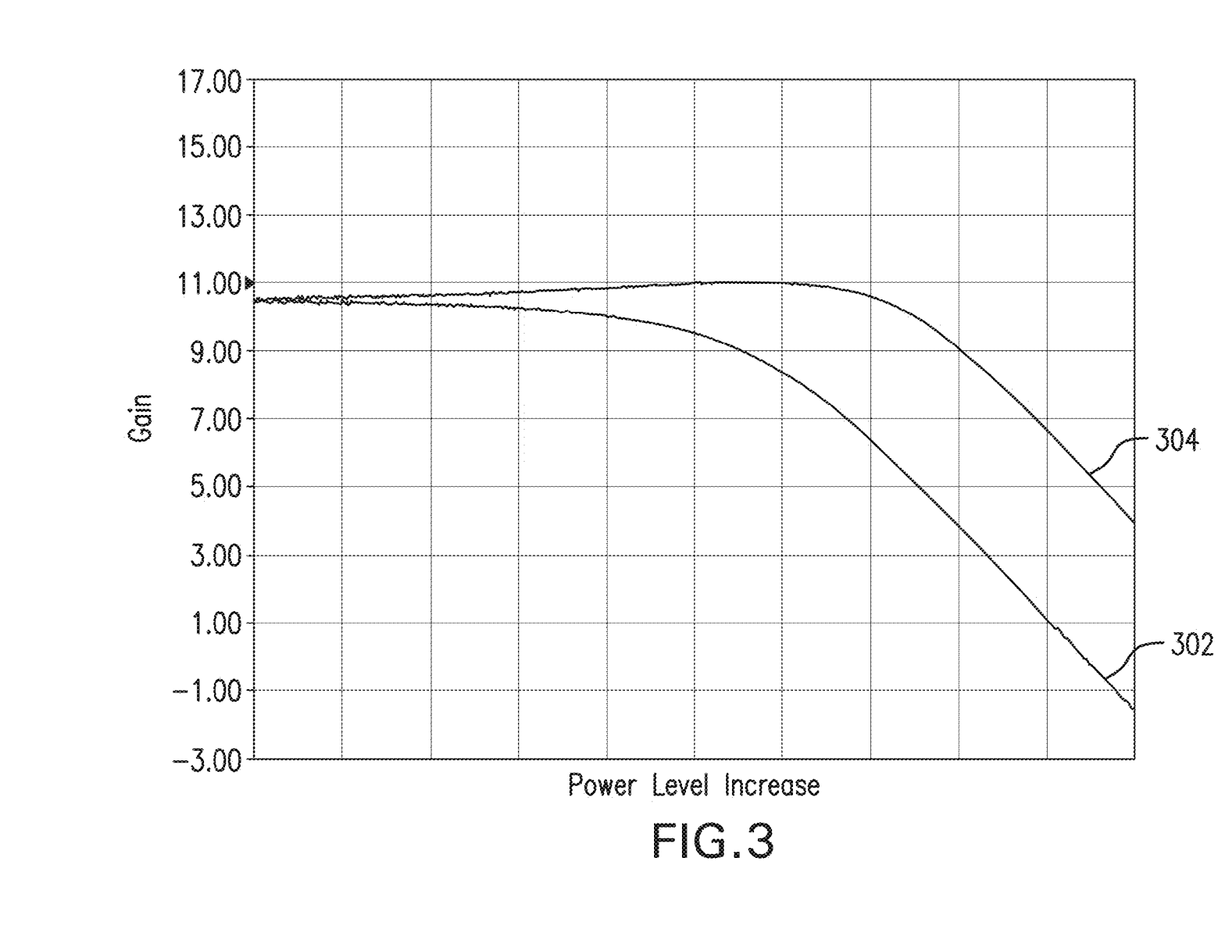
FIG. 3 is a graph showing measured data of the difference between the amplitude compression characteristics for a low-noise amplifier for one combination of nominal DC setting and RF adaptation level with and without its dynamically adapting bias circuit of FIG. 1 enabled.

FIG. 3 is a graph of measured data showing the difference between the amplitude compression characteristics for a low-noise amplifier, with and without dynamic bias adaptation from bias circuit 100 enabled. The X-axis shows the input power level of the RF signal, and the Y-axis shows the gain for a 500 MHz RF signal. Curve 302 shows the gain response of a low-noise amplifier with bias circuit 100 disabled, and curve 304 shows the same low-noise amplifier with bias circuit 100 enabled. The difference between curve 302 and curve 304 shows that bias circuit 100 increases the 1 dB compression point for the low-noise amplifier. The 1 dB compression point is the power level that causes the gain of the amplifier to drop by 1 dB from its small signal value.

Figure 4A:
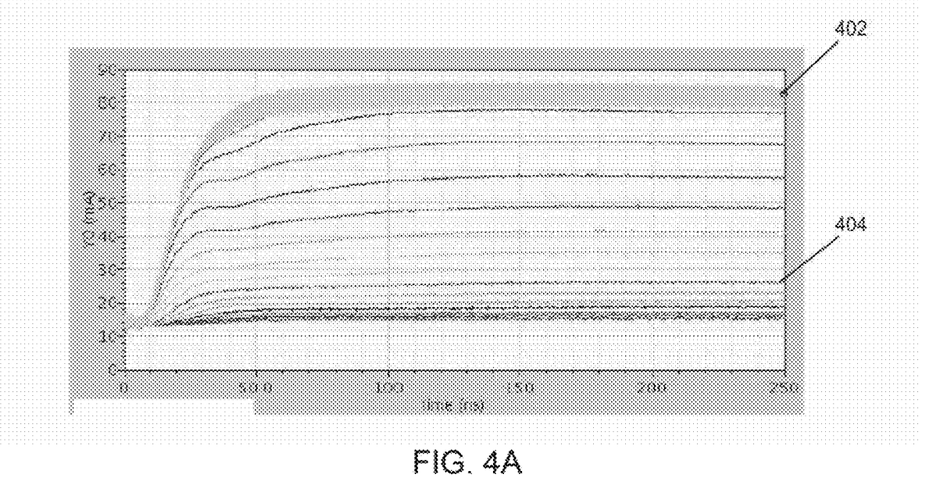
FIG. 4A is a graph showing the response time of bias adaptation at increasing RF power levels for a low-noise amplifier coupled to the bias circuit of FIG. 1.
Figure 4B:
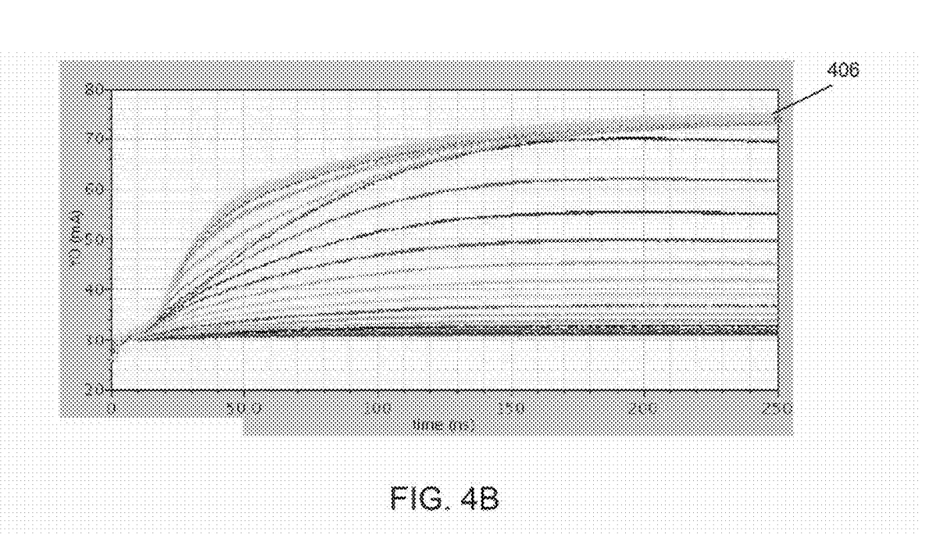
FIG. 4B is a graph showing the response time of bias adaptation at increasing RF power levels for a mixer coupled to the bias circuit of FIG. 1 and driven by the low-noise amplifier coupled to the bias circuit of FIG. 1.

FIGS. 4A and 4B show the bias behavior versus time of the cascaded LNA 202 and mixer 206 in signal processing system 200. The several curves represent increasing RF power levels from −30 to +7 dBm. The bias of mixer 206 also includes bias from LO driver amplifiers that drive the LO signal that mixer 206 uses to down-convert a signal from a high frequency to a low frequency. Each curve represents the time frame in nanoseconds for bias adaptation to take place at the respective RF input power level.

FIG. 4A shows the behavior of LNA 202 coupled with bias circuit 100 in signal processing system 200 to adapt to an input signal with an increasing strength. LNA 202 has a minimal DC nominal bias setting and the RF dynamic adaptation enabled. Curve 402 shows that it takes slightly less than 100 nS for bias circuit 100 to increase the bias signal for LNA 202 to its maximum bias level in response to an RF level of +7 dBm. The remainder of the curves in FIG. 4A show that it takes less time for the low-noise amplifier 102 to settle in response to smaller increases in RF power levels. For example, curve 404 shows that it takes about 50 nS for the dynamic bias adaptation of the LNA active circuit 102 to settle in response to an RF level of −10 dBm.

FIG. 4B shows a number of input response curves for active mixer 204 coupled with bias circuit 100 in signal processing system 200. Each curve represents the time it takes for the active mixer 204 coupled with bias circuit 100 to adapt to an input signal from LNA 202 that has an increasing strength. Curve 406 shows the maximum safe bias adaptation response, and that it is settled by around 200 nS. Similarly, the other curves in FIG. 4B show that it takes even less time for the mixer to settle in response to smaller increases in the RF signal.

Figure 5:
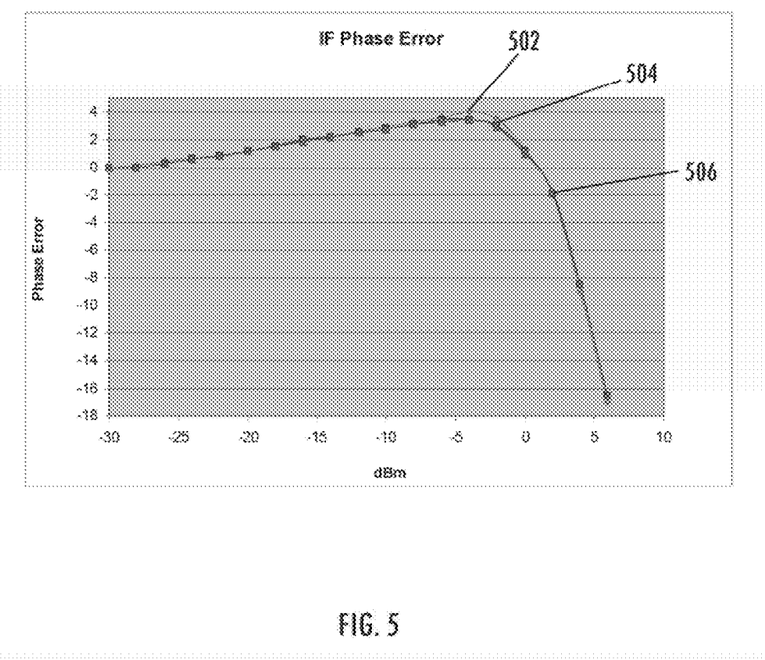
FIG. 5 is a graph of the settling time compared to the swept RF power levels of the signal processing system of FIG. 2, as the bias circuit of FIG. 1 adjusts the bias on the active circuits as the incoming RF power levels are increasing in signal strength.

FIG. 5 shows an example of the phase error of signal processing system 200 with dynamic bias adaptation for 3 time steps (150 nS, 200 nS and steady state) as signal processing system 200 adapts its bias to increasing RF power levels. The X-axis shows the input RF power level and covers −30 to +7 dBm. The Y-axis shows the phase error in degrees. Three curves are shown: curve 502 shows the phase error at 150 nS; curve 504 shows the phase error at 200 nS; and curve 506 shows the steady-state phase error. Each curve 502, 504, and 506 shows the phase response of the cascaded LNA 202 and mixer 206 of signal processing system 200 as the RF energy increases. Curve 502 shows that at 150 nS, LNA 202 and mixer 206 have settled with a maximum phase error of 4 degrees, which represents a nominal phase shift that is unlikely to result in any information loss or degradation of the RF signal. Curves 504 and 506 have a phase error that is slightly less than curve 502, which shows that the peak phase error occurs at slightly less than 150 ns before the output of cascaded LNA 202 and mixer 206 begin settling into their steady-state condition.

Curves 402 and 406 of FIG. 4 correspond to the maximum bias adaptation limits of the cascaded LNA 202 and mixer 206 of signal processing system 200 before they begin operating in a non-linear manner. This is represented in FIG. 5, which shows significant phase distortion for the input power levels above approximately 5 dBm. The cascaded LNA 202 and mixer 206 has a ratio of signal phase integrity to dynamic bias of 8:1 and a ratio of RF power to linearity adaptation of 64:1. The cascaded LNA 202 and mixer 206 has a signal integrity with an adaptation of 6400% RF power handling capability in roughly 150 ns. Above this safe level of operation, the cascaded LNA 202 and mixer 206 behave in a nonlinear fashion and produce signal distortion.

Figure 6A:
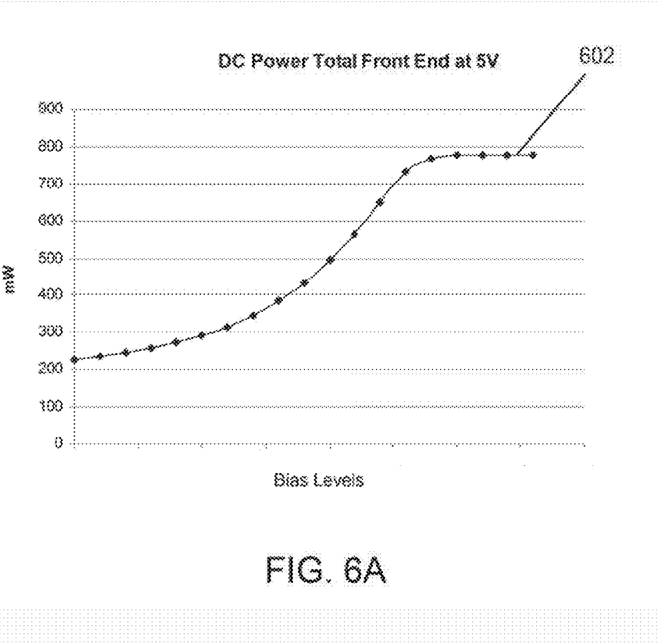
FIG. 6A is a graph showing the power consumption of the signal processing system of FIG. 2 with adaptive bias circuits in FIG. 1 at increasing RF power levels.

FIG. 6A is a graph showing the power consumption of cascaded LNA 202 and mixer 206 of signal processing system 200 with dynamic bias adaptation enabled for increasing RF power levels. The X-axis represents increasing RF power levels, and the Y-axis is power in milliwatts. Curve 602 shows the change in power consumption of the cascaded LNA 202 and mixer 206 of signal processing system 200, as the RF signal increases. The far right of graph 6A, where power consumption is the highest, shows the maximum safe power consumption and corresponds to the highest bias current levels shown in FIGS. 4A and 4B. With both LNA 202 and mixer 206 (along with LO buffer amps) drawing about 80 mA and operating at 5 V, this results in slightly less than 800 mW. The far left of graph 6A, where power consumption is the lowest, shows that the power consumption necessary for cascaded LNA 202 and mixer 206 of signal processing system 200 is slightly more than 200 mW. The small-signal power consumption of cascaded LNA 202 and mixer 206 and LO buffer of signal processing system 200 with dynamic adaptation enabled is nearly a four-fold decrease from the power necessary to maintain signal integrity for the strongest signals.

Figure 7:
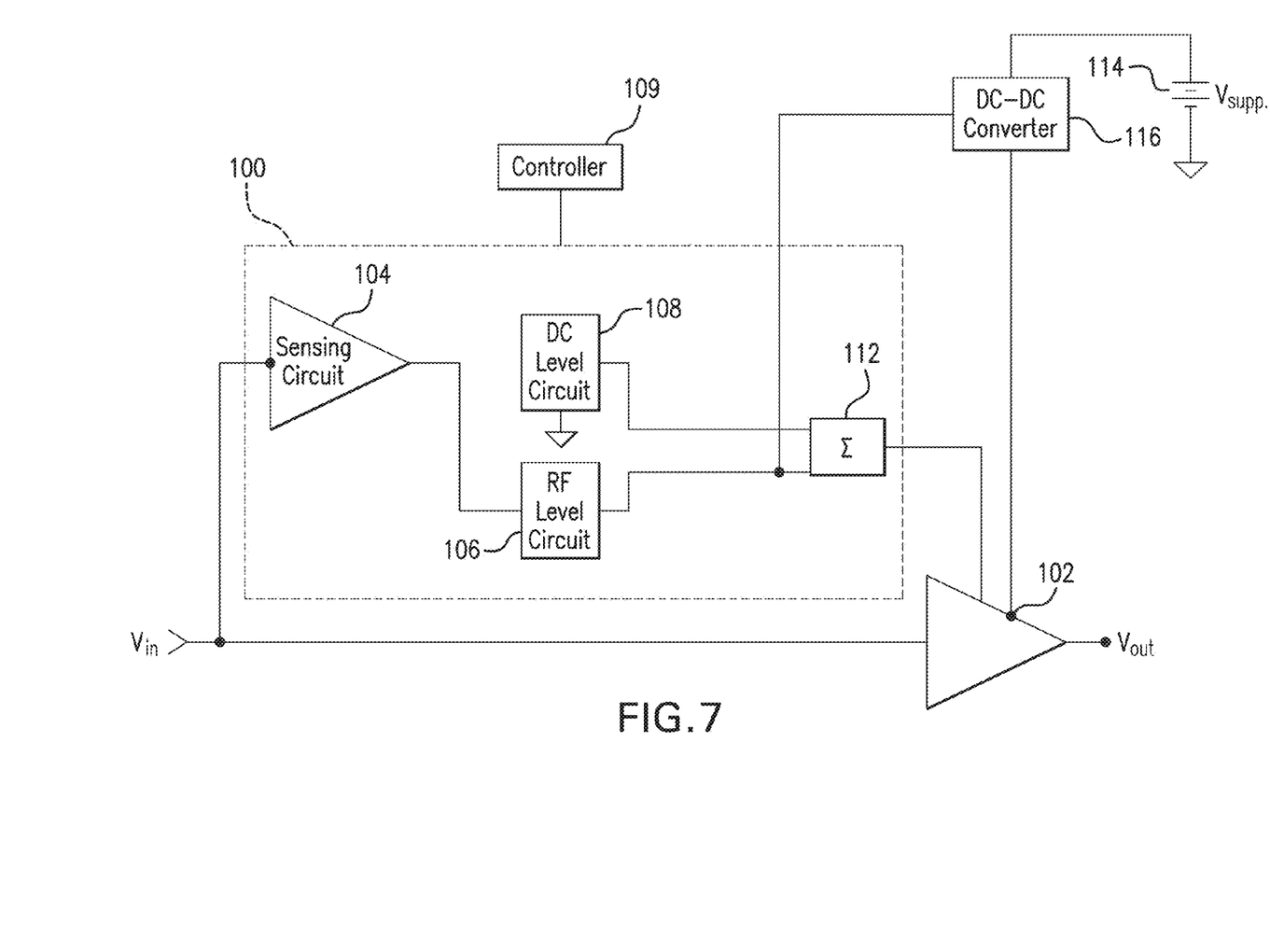
FIG. 7 is a schematic diagram of a DC-DC converter coupled with the bias circuit of FIG. 1.

Further power savings can be found with a DC-to-DC converter 116 coupled to voltage supply 114, as shown in FIG. 7, to reduce the operating voltages for the components while they are operating under most non-threat situations, in the absence of the strongest signals. DC-to-DC converter 116 receives the dynamically sensed RF amplitude bias adjusted signal from RF level circuit 106 and modifies the supply voltage in response to an increasing or decreasing RF signal level.

Figure 6B:
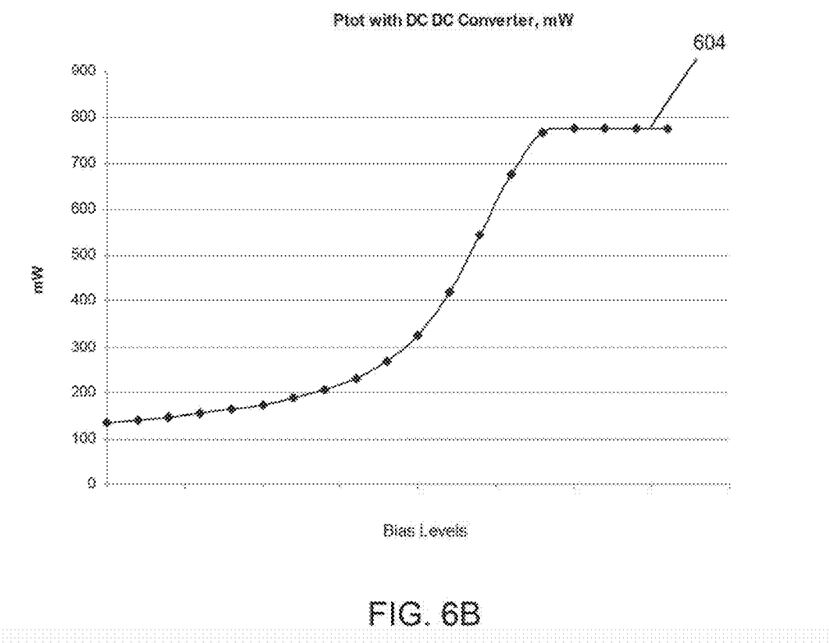
FIG. 6B is a graph showing the power consumption of the signal processing system of FIG. 2 with adaptive bias circuits in FIG. 1 at increasing RF power levels and a variable DC voltage control to reduce voltage at low RF power levels.

FIG. 6B shows the power consumption capabilities of the cascaded LNA 202 and mixer 206 of signal processing system 200 when the system of FIGS. 1 and 2 utilize a DC-to-DC converter 116 to reduce the operating voltages for the components while they are operating under most non-threat situations, in the absence of the strongest signals. Curve 604 shows the change in power consumption as the RF signal increases. The far right of graph 6B, where power consumption is the highest, shows that the power consumption necessary for its dynamic range is slightly less than 800 mW. The far left of the graph 6A, where power consumption is the lowest, shows that the power consumption for the cascaded LNA 202 and mixer 206 and LO buffer of signal processing system 200 to process small-signals is slightly more than 100 mW. The small-signal power consumption of the cascaded LNA 202 and mixer 206 of signal processing system 200 is nearly a six-fold decrease from the power necessary to operate it in order for it to handle the strongest signals.

Bias circuit 100 can dynamically adjust the bias signal in the cascaded LNA 202 and mixer 206 of signal processing system 200 in less than 150 nS in the presence of the strongest signals. This incredibly fast reaction time allows signal processing system 200 to operate at nearly four to six times less power under most non-threat situations, in the absence of the strongest signals. Bias circuit 100 allows system designers to decrease the battery size, which decreases the size, weight, as well as the overall power consumption of signal processing system 200, which also reduces its heat load and can lead to further reductions in size and weight and an increase in the system's 200 useful life.

The various active devices 102 in signal processing system 200 and bias circuit 100 are constructed with a combination of discrete components, including transistors. Transistors in the various active devices 102 of signal processing system 200 and bias circuit 100 can be made using various fabrication technologies, such as silicon (SI) substrate, silicon-germanium (Si—Ge) substrate, gallium-arsenide (GaAs) substrate, or gallium-nitride (GaN) on a silicon substrate. Various types of transistors are suitable for constructing the various active circuits 102 in signal processing system 200 and bias circuit 100, including a bipolar terminal transistor (BJT), metallic oxide semiconductor (MOS), complementary metallic oxide semiconductor (CMOS), a bipolar CMOS (Bi-CMOS), heterojunction bipolar transistor (HBT), metal semiconductor field effect transistor (MES-FET) and high electron mobility transistor (HEMT).

While the present invention has been particularly shown and described with reference to exemplary embodiments thereof, it should be understood by those of ordinary skill in the art that various changes, substitutions and alterations could be made herein without departing from the scope of the invention as defined by appended claims and their equivalents. For example, the term "coupled" used herein can mean a direct coupling between two components or an in-direct coupling between two components with one or more other components positioned therebetween, in that regard coupling of components means that the components are in electrical communication with each other.

What is claimed is:

1. A dynamically adjustable bias circuit for an active RF circuit, the bias circuit comprising:
    a broadband radio frequency (RF) sensor having an input port and an output port, the input port of the broadband RF sensor being coupled to an input port of the active RF circuit for sensing a broadband RF signal;
    a summing circuit in communication with the broadband RF sensor and coupled to the active RF circuit, wherein the summing circuit produces a bias signal for the active RF circuit and increases the bias signal in response to an increase in the broadband RF signal and decreases the bias signal in response to a decrease in the broadband RF signal;
    wherein the summing circuit has a first input port to receive a nominal direct current (DC) signal, a second input port coupled to the output port of the broadband RF sensor to receive an RF level signal that is representative of an RF power level of the broadband RF signal, and an output port coupled to the active RF circuit, wherein the summing circuit adds the RF level signal to the nominal DC signal to produce the bias signal for the active RF circuit; and
    a controller coupled to the summing circuit for modifying the nominal DC signal;
    an RF-power level circuit with an input port coupled to the output port of the broadband RF sensor and an output port coupled to a first input port of the summing circuit, wherein the RF-power level circuit produces an RF level signal that is representative of the RF power level; and
    a DC level circuit with an output port coupled to a second input port of the summing circuit for providing a nominal DC signal, wherein the summing circuit adds the RF level signal to the nominal DC signal to produce the bias signal for the active RF circuit.

2. The bias circuit of claim 1, wherein the controller is adapted to turn off the RF level signal to the summing circuit.

3. The bias circuit of claim 1, wherein the DC level circuit produces a minimum bias signal for the active RF circuit.

4. The bias circuit of claim 1, wherein the active RF circuit is an amplifier having a generally constant gain and phase output across a plurality of bias adjustment ranges to prevent signal distortion.

5. The bias circuit of claim 1, wherein the active RF circuit is a mixer having a generally constant gain and phase output across a plurality of bias adjustment ranges to prevent signal distortion.

6. A method for dynamically adjusting a bias signal to an active broadband radio frequency (RF) circuit, the method comprising:
sensing a broadband RF signal at an input port of the active broadband RF circuit;
summing an RF level signal that is representative of an RF power level with a nominal direct current (DC) signal to produce the bias signal;
increasing the bias signal to the active broadband RF circuit in response to an increase in power level of the broadband RF signal;
decreasing the bias signal to the active broadband RF circuit in response to a decrease in power level of the broadband RF signal;
producing an RF level signal that is representative of the RF power level with an RF-power level circuit having an input port coupled to an output port of a sensing circuit and an output port coupled to a first input port of a summing circuit; and
providing a nominal DC signal with a DC level circuit having an output port coupled to a second input port of the summing circuit, wherein the summing circuit adds the RF level signal to the nominal DC signal to produce the bias signal for the active broadband RF circuit.

7. The method of claim 6, and further comprising turning off the RF level signal to provide only the nominal DC signal to the active broadband RF circuit.

8. The method of claim 7, and further providing an RF level circuit to produce the RF level signal.

9. The method of claim 8, and further comprising modifying a voltage supply signal to the active broadband RF circuit in response to an increase in power level of the broadband RF signal and in response to a decrease in power level of the broadband RF signal.

10. A radio frequency (RF) receiver, comprising:
an active circuit having an input port for receiving a broadband RF signal and an output port for producing a modified RF signal; and
a bias circuit coupled to the active circuit, the bias circuit including,
an RF sensor having an input port and an output port, the input port of the RF sensor being coupled to the input port of the active circuit for sensing the broadband RF signal,
a summing circuit having a first input port for receiving a nominal direct current (DC) signal, a second input port coupled to the output port of the RF sensor for receiving an RF level signal that is representative of an RF power level, and an output port coupled to the active circuit for producing a bias signal, wherein the summing circuit increases the bias signal to the active circuit in response to an increase in power level of the broadband RF signal and decreases the bias signal to the active circuit in response to a decrease in power level of the broadband RF signal, and
a controller coupled to the bias circuit for modifying the nominal DC signal wherein the controller is adapted to turn off the RF level signal to the summing circuit;
an RF-power level circuit having an input port coupled to the output port of the RF sensor and an output port coupled to the summing circuit, wherein the RF-power level circuit produces the RF level signal; and
a DC level circuit with an output port coupled to a second input port of the summing circuit for providing the nominal DC signal.

11. The RF receiver of claim 10, and further comprising a voltage supply to provide a supply voltage to the active circuit, wherein the voltage supply modifies the supply voltage in response to an increase in power level of the broadband RF signal and in response to a decrease in power level of the broadband RF signal.

12. The RF receiver of claim 11, wherein the active RF-circuit is one of an amplifier and a mixer, each of which having a generally constant gain and phase output across a plurality of bias adjustment ranges to prevent signal distortion.

13. The bias circuit of claim 1, wherein the controller adjusts a slope of the bias signal.

* * * * *